United States Patent
Kou et al.

(10) Patent No.: US 11,375,310 B2
(45) Date of Patent: Jun. 28, 2022

(54) AUDIO SIGNAL PROCESSING METHOD AND APPARATUS, AND DEVICE

(71) Applicant: Huawei Technologies Co., Ltd., Guangdong (CN)

(72) Inventors: Yiwei Kou, Hangzhou (CN); Xiansheng Li, Hangzhou (CN); Xiangyu Zhao, Shenzhen (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 0 days.

(21) Appl. No.: 17/301,466

(22) Filed: Apr. 5, 2021

(65) Prior Publication Data

US 2021/0227323 A1 Jul. 22, 2021

Related U.S. Application Data

(63) Continuation of application No. PCT/CN2019/109273, filed on Sep. 30, 2019.

(30) Foreign Application Priority Data

Oct. 6, 2018 (CN) .......................... 201811164593.X

(51) Int. Cl.
*H04R 3/00* (2006.01)
*H04R 29/00* (2006.01)

(52) U.S. Cl.
CPC ........... *H04R 3/007* (2013.01); *H04R 29/003* (2013.01); *H04R 2499/11* (2013.01)

(58) Field of Classification Search
CPC .. H04R 3/007; H04R 29/003; H04R 2499/11; H04R 29/001
See application file for complete search history.

(56) References Cited

U.S. PATENT DOCUMENTS 8,774,419 B2 7/2014 Risbo et al.
9,226,071 B2 * 12/2015 Polleros ................ H04R 9/022
(Continued)

FOREIGN PATENT DOCUMENTS

CN 101877807 A 11/2010
CN 102149035 A 8/2011
(Continued)

*Primary Examiner* — Jason R Kurr
(74) *Attorney, Agent, or Firm* — Womble Bond Dickinson (US) LLP

(57) ABSTRACT

The present application provides a method of audio signal processing. The method comprises obtaining a voice coil direct current resistance of a speaker. The method further comprises obtaining an audio input signal to be input into the speaker. The method further comprises determining an audio input power based on the voice coil direct current resistance and the audio input signal. The method further comprises obtaining a thermal model of the speaker, and determining a transient power threshold based on the audio input power and the thermal model. The method further comprises determining a power constraint gain based on the audio input power and the transient power threshold. The method further comprises obtaining a voice coil temperature of the speaker. The method further comprises determining a temperature constraint gain based on the voice coil temperature and an upper operating temperature limit of the speaker. The method further comprises adjusting the audio input signal based on the power constraint gain and the temperature constraint gain, to obtain a target signal.

17 Claims, 10 Drawing Sheets

(56) References Cited

U.S. PATENT DOCUMENTS

| | | | |
|---|---|---|---|
| 9,807,502 B1* | 10/2017 | Hatab | H03G 5/165 |
| 10,250,978 B1* | 4/2019 | Palit | H03G 3/001 |
| 2002/0118841 A1 | 8/2002 | Button et al. | |
| 2005/0163324 A1 | 7/2005 | Neunaber | |
| 2015/0215704 A1 | 7/2015 | Magrath et al. | |
| 2017/0094408 A1* | 3/2017 | Napoli | H03G 3/20 |
| 2018/0213322 A1* | 7/2018 | Napoli | G10L 25/21 |
| 2019/0110145 A1* | 4/2019 | Lawrence | H03F 3/181 |

FOREIGN PATENT DOCUMENTS

| | | |
|---|---|---|
| CN | 102196336 A | 9/2011 |
| CN | 102843634 A | 12/2012 |
| CN | 103873985 A | 6/2014 |
| CN | 105573398 A | 5/2016 |
| CN | 106817655 A | 6/2017 |
| WO | 2017055808 A1 | 4/2017 |

\* cited by examiner

AUDIO SIGNAL PROCESSING METHOD AND APPARATUS, AND DEVICE

CROSS-REFERENCE TO RELATED APPLICATIONS

This application is a continuation of International Application No. PCT/CN2019/109273, filed on Sep. 30, 2019, which claims priority to Chinese Patent Application No. 201811164593.X, filed on Oct. 6, 2018, the disclosures of which are incorporated herein by reference in their entireties.

TECHNICAL FIELD

The present application relates to the field of terminal technologies, and in particular, to an audio signal processing method and apparatus, and a device.

BACKGROUND

With rapid growth of demands for portable terminal devices, miniature speakers are increasingly applied to small terminals such as mobile phones and tablet computers. Currently, the most commonly used miniature speaker in a small terminal device is a moving coil speaker (that is also referred to as an electro-dynamic speaker, and has a working principle that an input current generates a changing magnetic field through a coil, so that a diaphragm of the speaker vibrates to generate sound). The moving coil speaker has characteristics of having very low electro-acoustic conversion efficiency (usually less than 1%) and generating heat. In an actual working scenario, to improve subjective experience, for example, improve a speaker volume of a terminal device such as a mobile phone, a relatively large drive voltage usually needs to be applied to a speaker in the terminal device, so that the speaker works in a large-signal state, or even sometimes reaches a physical limit state. However, a speaker working in a large-signal state usually has a relatively high temperature. If no temperature protection measure is applied, a voice coil of the speaker may be scattered to generate noise or even burn the entire speaker.

For a problem of speaker temperature protection, currently, a general temperature protection method used by a chip manufacturer of a power amplifier (PA) is as follows: A direct current resistance of a speaker voice coil is calculated based on feedback signals of the power amplifier, such as a current signal and a voltage signal, to detect a temperature or input power of the speaker voice coil, and if a detection result exceeds a corresponding threshold, an input signal is attenuated by a specific gain.

In a conventional technology, for example, in U.S. Pat. No. 8,774,419B2, a steady-state power threshold is specifically calculated by using a feedback signal of a power amplifier and a thermal model of a speaker (the thermal model is used to describe a relationship between a thermal run-away power and a voice coil temperature of the speaker, and an equivalent resistor-capacitor circuit is usually used to simulate a heat dissipation process in the speaker). The steady-state power threshold is used to constrain a transient power of an input signal of the speaker. When the transient power of the input signal is greater than the steady-state power threshold, temperature protection is performed by attenuating a fixed gain of the input signal. In this kind of method, a same control means may be used in any working state of the speaker.

However, this technology has at least the following drawbacks:

(1) Generally, the steady-state power threshold calculated based on the thermal model of the speaker is far less than a transient input power of a voice coil of the speaker. Therefore, if the steady-state power threshold is used to control the transient input power, temperature over-protection (an over-protection phenomenon caused by improper setting of a target threshold in a control process) is caused, that is, a control gain output by a power limiter is at a relatively low level for a long time, which causes a relatively large loss of subjective loudness of the speaker. Therefore, a speaker volume of the speaker cannot be maximized, performance of the speaker cannot be fully exerted, and the speaker cannot be protected more flexibly.

(2) An attenuation fixed gain brings sudden changes in sound quality, which deteriorates subjective auditory experience.

SUMMARY

The present application provides an audio signal processing method. In the method, a power constraint is implemented based on a power of a current input signal and a currently calculated transient power threshold, and a temperature constraint is implemented based on a current voice coil temperature and an upper operating temperature limit of a speaker. A joint gain control policy with the two constraints and a dynamic gain control calculation method are proposed, to resolve problems of speaker over-protection and output gain sudden changes. Therefore, subjective experience such as a speaker volume of a terminal device can be maximally improved while a voice coil temperature of the speaker is protected from being overloaded.

Specific technical solutions provided in embodiments of the present application are as follows:

According to a first aspect, an embodiment of the present application provides an audio signal processing method. The method includes: obtaining a voice coil direct current resistance of a speaker; obtaining an audio input signal to be input into the speaker; determining an audio input power based on the voice coil direct current resistance and the audio input signal; obtaining a thermal model of the speaker, and determining a transient power threshold based on the audio input power and the thermal model; determining a power constraint gain based on the audio input power and the transient power threshold, where if the audio input power is greater than the transient power threshold, the power constraint gain is less than 1; obtaining a voice coil temperature of the speaker; determining a temperature constraint gain based on the voice coil temperature and an upper operating temperature limit of the speaker, where if the voice coil temperature is greater than the upper operating temperature limit of the speaker, the temperature constraint gain is less than 1; and adjusting the audio input signal based on the power constraint gain and the temperature constraint gain, to obtain a target signal.

According to a second aspect, an embodiment of the present application provides an audio signal processing apparatus. The apparatus includes: a direct current resistance calculation module, configured to obtain a voice coil direct current resistance of a speaker; an obtaining module, configured to obtain an audio input signal to be input into the speaker; a power calculation module, configured to determine an audio input power based on the voice coil direct current resistance and the audio input signal; a transient power threshold calculation module, configured to obtain a thermal model of the speaker, and determine a transient power threshold based on the audio input power and the thermal model of the speaker; a power constraint module, configured to determine a power constraint gain based on the audio input power and the transient power threshold, where if the audio input power is greater than the transient power threshold, the power constraint gain is less than 1; a temperature calculation module, configured to obtain a voice coil temperature of the speaker; a temperature constraint module, configured to determine a temperature constraint gain based on the voice coil temperature and an upper operating temperature limit of the speaker, where if the voice coil temperature is greater than the upper operating temperature limit of the speaker, the temperature constraint gain is less than 1; and a gain application module, configured to adjust the audio input signal based on the power constraint gain and the temperature constraint gain, to obtain a target signal.

According to technical solutions of the method and the apparatus provided in the embodiments of the present application, a power constraint is implemented based on a power of a current input signal and a currently calculated transient power threshold, and a temperature constraint is implemented based on a current voice coil temperature and an upper operating temperature limit of a speaker. A joint gain control policy with the two constraints and a dynamic gain control calculation method are proposed, to resolve problems of speaker over-protection and output gain sudden changes. Therefore, subjective experience such as a speaker volume of a terminal device can be maximally improved while a voice coil temperature of the speaker is protected from being overloaded.

In an embodiment, the power constraint gain is positively correlated with a ratio of the transient power threshold to the audio input power.

In an embodiment, the temperature constraint gain is positively correlated with a ratio of the upper operating temperature limit to the voice coil temperature.

In an embodiment, the method further includes: if the audio input power is less than or equal to the transient power threshold, the power constraint gain is equal to 1.

In an embodiment, the method further includes: if the voice coil temperature is less than or equal to the upper operating temperature limit of the speaker, the temperature constraint gain is equal to 1.

In an embodiment, the obtaining a voice coil direct current resistance of a speaker includes: obtaining feedback voltage signals and feedback current signals at two ends of the speaker by using a feedback circuit; and obtaining the voice coil direct current resistance based on the feedback voltage signals and the feedback current signals. The method is performed by the direct current resistance calculation module. This design is applicable to an application scenario in which two input ends of a speaker have feedback structures.

In an embodiment, the obtaining a voice coil direct current resistance of a speaker includes:

obtaining a voice coil equivalent thermal impedance transfer function of the speaker; calculating a variation amount of the voice coil temperature based on the voice coil equivalent thermal impedance transfer function; and calculating the voice coil direct current resistance of the speaker based on the variation amount of the voice coil temperature. The method is performed by the direct current resistance calculation module. This design is applicable to an application scenario in which two input ends of a speaker do not have feedback structures. Certainly, this design is also applicable to an application scenario in which two input ends of a speaker have feedback structures. In the application scenario in which the two input ends of the speaker have the feedback structures, $R_e$ calculation methods are more diversified and flexible. The calculating a variation amount of the voice coil temperature based on the voice coil equivalent thermal impedance transfer function may include: obtaining the audio input signal to be input into the speaker; and calculating the variation amount of the voice coil temperature based on the audio input signal of the speaker and the voice coil equivalent thermal impedance transfer function.

In an embodiment, the obtaining a voice coil temperature of the speaker includes: calculating the voice coil temperature of the speaker based on the voice coil direct current resistance. The method is performed by the temperature calculation module.

In an embodiment, the obtaining a voice coil temperature of the speaker includes: obtaining the voice coil equivalent thermal impedance transfer function of the speaker; and calculating the voice coil temperature based on the voice coil equivalent thermal impedance transfer function. The method is performed by the temperature calculation module. This design can be independent of calculation of a direct current resistance. The calculating the voice coil temperature based on the voice coil equivalent thermal impedance transfer function may include: obtaining the audio input signal to be input into the speaker; and calculating the voice coil temperature based on the audio input signal of the speaker and the voice coil equivalent thermal impedance transfer function.

In an embodiment, the method further includes: performing digital-to-analog conversion and amplification on the target signal, and transmitting an amplified analog signal to the speaker for playing.

In the foregoing embodiments, a processor may invoke a program and an instruction in a memory to perform corresponding processing, such as algorithm implementation and signal obtaining.

According to a third aspect, an embodiment of the present application provides an audio signal processing method. The method includes: obtaining a voice coil direct current resistance of a speaker; obtaining an audio input signal to be input into the speaker; determining an audio input power based on the voice coil direct current resistance and the audio input signal; obtaining a thermal model of the speaker, and determining a transient power threshold based on the audio input power and the thermal model; determining a power constraint gain based on the audio input power and the transient power threshold, where if the audio input power is greater than the transient power threshold, the power constraint gain is less than 1; and adjusting the audio input signal based on the power constraint gain, to obtain a target signal.

According to a fourth aspect, an embodiment of the present application provides an audio signal processing method. The method includes: obtaining a voice coil direct current resistance of a speaker; obtaining an audio input signal to be input into the speaker; obtaining a voice coil temperature of the speaker; determining a temperature constraint gain based on the voice coil temperature and an upper operating temperature limit of the speaker, where if the voice coil temperature is greater than the upper operating temperature limit of the speaker, the temperature constraint gain is less than 1; and adjusting the audio input signal based on a power constraint gain and the temperature constraint gain, to obtain a target signal.

According to a fifth aspect, an embodiment of the present application provides a terminal device, including a memory, a processor, and a bus. The memory and the processor are connected through the bus. The memory is configured to store a computer program and instructions. The processor is configured to invoke the computer program and the instructions that are stored in the memory, and is further configured to enable the terminal device to perform the method in any one of the foregoing possible designs.

In an embodiment, the terminal device further includes an antenna system. The antenna system receives and sends wireless communication signals under control of the processor, to implement wireless communication with a mobile communications network. The mobile communications network includes one or more of the following: a GSM network, a CDMA network, a 3G network, a 4G network, a 5G network, an FDMA (frequency-division multiple access) network, a TDMA (time-division multiple access) network, a PDC (personal digital cellular) network, a TACS (total access communication system) network, an AMPS (advanced mobile phone system) network, a WCDMA (wideband code division multiple access) network, a TDSCDMA (time division synchronous code division multiple access) network, a Wi-Fi network, and an LTE network.

The technical solutions in the foregoing embodiments may be combined without going against nature.

In the conventional technology, temperature protection is performed on a speaker in a single manner of temperature constraint or power constraint. For example, in the foregoing conventional technology, a power limiter is used to constrain an input signal power, to implement temperature protection. In an actual working scenario, both a temperature and an input power of the speaker need to be simultaneously considered to accurately distinguish various signals, to implement optimal temperature protection measures. For example, most music signals with high powers and high temperatures and music signals with low powers and low temperatures may be distinguished by using only powers or temperatures. However, for some music signals with high powers but low temperatures and signals with very high powers, such as frequency scanning powers, and very high temperatures, if the temperatures and powers are not constrained at the same time, speaker volumes of the music signals may decrease suddenly, and a temperature of a frequency scanning signal exceeds an upper safety limit of the speaker. Therefore, in the conventional technology, an extreme signal, for example, a frequency scanning signal, cannot be completely and accurately distinguished from a music signal, and an optimal temperature protection measure cannot be implemented based on a current working state of the speaker. In addition, because an input signal is attenuated by a fixed gain, a speaker volume of the speaker cannot reach a maximum value, and performance of the speaker cannot be fully used. A technical problem 1 to be resolved in the present application is to accurately distinguish various working scenarios and signals based on a voice coil temperature and a transient input power of a speaker, so that a temperature protection module outputs a dynamic gain to control a smooth change of an output signal gain, and resolve a pain point of a sudden change of a speaker volume of a terminal device.

In the conventional technology, a steady-state power threshold is used to limit a transient power. Because the steady-state power threshold is far less than the transient power, temperature over-protection is caused, and consequently, the speaker volume of the speaker cannot reach the maximum value. A technical problem 2 to be resolved in the present application is to calculate a transient power threshold of an input signal in real time based on a voice coil temperature of a speaker, and use the transient power threshold to constrain a power of an input signal, to resolve temperature over-protection caused by improper use of a power constraint threshold.

For a low-end terminal device whose PA cannot provide a feedback signal, in the conventional technology, a voice coil direct current resistance of a speaker cannot be detected to calculate a voice coil temperature. Therefore, the voice coil temperature of the speaker cannot be monitored in real time to perform optimal temperature protection on the speaker. A technical problem 3 to be resolved by the present application is that, in a case that a feedback signal cannot be collected without a feedback structure, a voice coil temperature of a speaker can still be predicted in real time, to resolve a problem that a speaker of a low-end terminal device cannot implement optimal temperature protection.

DESCRIPTION OF EMBODIMENTS

The following clearly describes the technical solutions in the embodiments of the present application with reference to the accompanying drawings in the embodiments of the present application. It is clear that the described embodiments are merely some but not all of the embodiments of the present application. All other embodiments obtained by persons of ordinary skill in the art based on the embodiments of the present application without creative efforts shall fall within the protection scope of the present application.

In the embodiments of the present application, a terminal may be a device that provides a user with video shooting and/or data connectivity, a handheld device with a wireless connection function, or another processing device connected to a wireless modem, for example, a digital camera, a single-lens reflex camera, a mobile phone (or referred to as a "cellular" phone), or a smartphone. The terminal may be a portable, pocket-sized, handheld, or wearable device (for example, a smart watch), a tablet computer, a personal computer (PC), a PDA (personal digital assistant), a vehicle-mounted computer, a drone, an aerial device, or the like.

Figure 1:
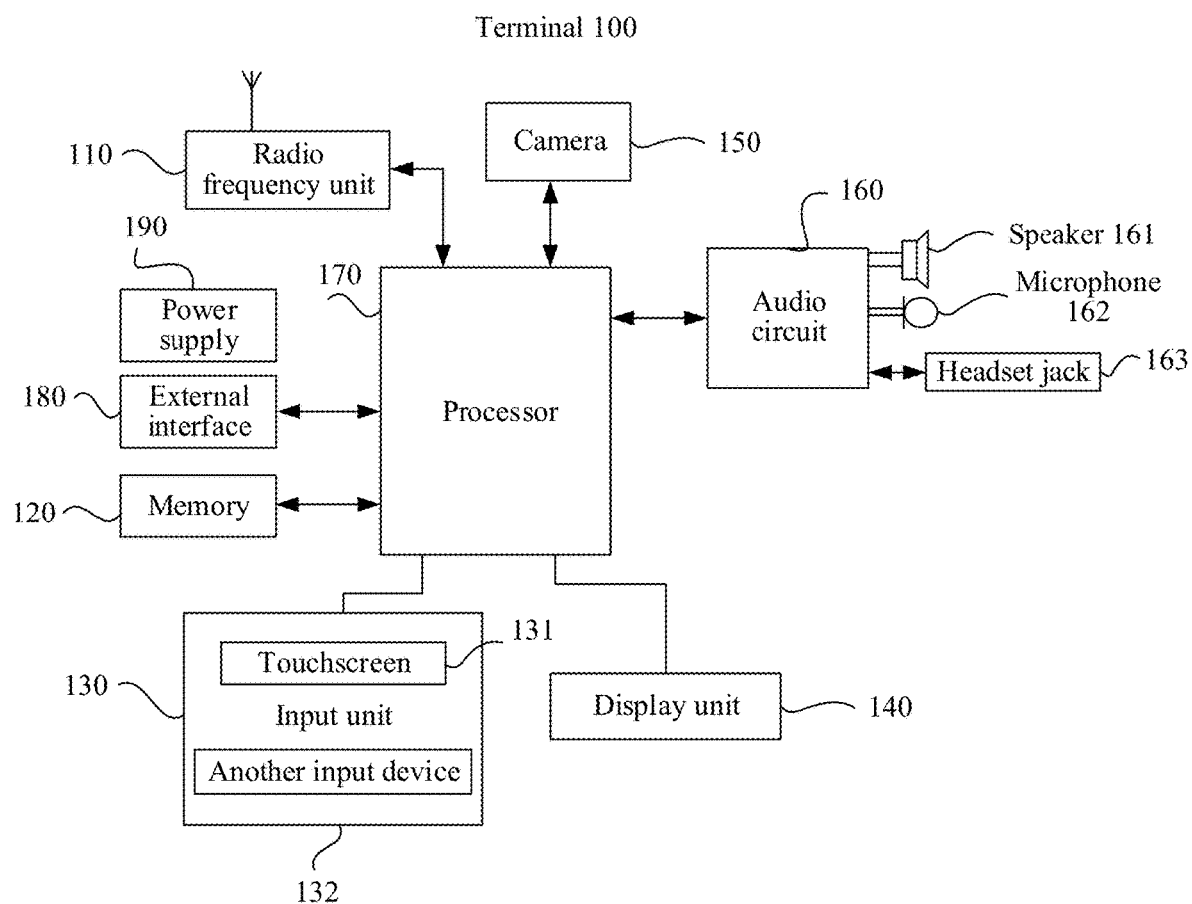
FIG. 1 is a schematic diagram of a structure of a terminal according to an embodiment.

FIG. 1 is a schematic diagram of an optional hardware structure of a terminal 100.

As shown FIG. 1, the terminal 100 may include components such as a radio frequency unit 110, a memory 120, an input unit 130, a display unit 140, a camera 150, an audio circuit 160 (including a speaker 161 and a microphone 162), a processor 170, an external interface 180, and a power supply 190. Person skilled in the art would understand that FIG. 1 is merely an example of an intelligent terminal or a multi-function device, and does not constitute a limitation on the intelligent terminal or the multi-function device. The intelligent terminal or the multi-function device may include more or fewer components than those shown in the figure, or combine some components, or include different components. For example, there are at least the memory 120, the processor 170, and the audio circuit 160 (including the speaker 161).

The camera 150 is configured to collect an image or a video, and may be triggered and enabled through an application program instruction, to implement a photographing function or a video recording function. The camera may include components such as an imaging lens, a light filter, and an image sensor. Light rays emitted or reflected by an object enter the imaging lens and converge on the image sensor through the light filter. The imaging lens is mainly configured to converge, into an image, light emitted or reflected by all objects in a photographing angle of view (which may also be referred to as a to-be-shot scenario, to-be-shot objects, a target scenario, or target objects, and may also be understood as a scenario image that a user expects to shoot). The light filter is mainly configured to filter out a redundant light wave (for example, a light wave except visible light, such as infrared light) in light rays. The image sensor is mainly configured to perform optical-to-electrical conversion on a received optical signal, convert the optical signal into an electrical signal, and input the electrical signal to the processor 170 for subsequent processing. The camera may be located in the front of the terminal device, or may be located on the back of the terminal device. A specific quantity and a specific arrangement manner of cameras may be flexibly determined based on a requirement of a designer or a manufacturer policy. This is not limited in this application.

The input unit 130 may be configured to receive input digit or character information, and generate a key signal input related to user settings and function control of the portable multi-function apparatus. In an embodiment, the input unit 130 may include a touchscreen 131 and/or another input device 132. The touchscreen 131 may collect a touch operation (for example, an operation performed by the user on the touchscreen or near the touchscreen by using any proper object such as a finger, a joint, or a stylus) of the user on or near the touchscreen, and drive a corresponding connection apparatus based on a preset program. The touchscreen may detect a touch action of the user on the touchscreen, convert the touch action into a touch signal, and send the touch signal to the processor 170, and can receive and execute a command sent by the processor 170. The touch signal includes at least touch point coordinate information. The touchscreen 131 may provide an input interface and an output interface between the terminal 100 and the user. In addition, the touchscreen may be implemented in various types such as a resistive type, a capacitive type, an infrared type, and a surface acoustic wave type. In addition to the touchscreen 131, the input unit 130 may further include the another input device. In an embodiment, the input device 132 may include but is not limited to one or more of a physical keyboard, a function key (such as a volume control key 132 or a power on/off key 133), a trackball, a mouse, a joystick, and the like.

The display unit 140 may be configured to display information input by the user or information provided for the user, various menus of the terminal 100, an interaction interface, file display, and/or playing of any multimedia file. In this embodiment, the display unit is further configured to display the image or video obtained by the device by using the camera 150. The image or video may include a preview image or preview video in some shooting modes, a shot initial image or video, and a target image or video that is processed through a specific algorithm after shooting.

Further, the touchscreen 131 may cover a display panel 141. After detecting a touch operation on or near the touchscreen 131, the touchscreen 131 transfers the touch operation to the processor 170 to determine a type of a touch event. Then the processor 170 provides a corresponding visual output on the display panel 141 based on the type of the touch event. In this embodiment, the touchscreen and the display unit may be integrated into one component to implement input, output, and display functions of the terminal 100. For ease of description, in this embodiment, a touch display screen represents a function set of the touchscreen and the display unit. In some embodiments, the touchscreen and the display unit may alternatively be used as two independent components.

The memory 120 may be configured to store an instruction and data. The memory 120 may mainly include an instruction storage area and a data storage area. The data storage area may store data such as a media file and a text. The instruction storage area may store software units such as an operating system, an application, and an instruction required by at least one function, or a subset and an extension set of the software units. The memory 120 may further include a non-volatile random access memory and provide the processor 170 with functions including managing hardware, software, and data resources in a computing processing device and supporting control on the software and an application. The memory 120 is further configured to store a multimedia file, and store an execution program and an application.

The processor 170 is a control center of the terminal 100, and is connected to various parts of an entire mobile phone through various interfaces and lines. The processor 170 performs various functions and data processing of the terminal 100 by running or executing the instruction stored in the memory 120 and invoking the data stored in the memory 120, to perform overall control on the mobile phone. Optionally, the processor 170 may include one or more processing units. Preferably, the processor 170 may be integrated with an application processor and a modem processor. The application processor mainly processes an operating system, a user interface, an application program, and the like. The modem processor mainly processes wireless communication. It can be understood that the modem processor may not be integrated into the processor 170. In some embodiments, the processor and the memory may be implemented on a single chip. In some embodiments, the processor and the memory may be separately implemented on independent chips. The processor 170 may be further configured to: generate a corresponding operation control signal, transmit the operation control signal to a corresponding component of a computing processing device, and read and process data in software, especially read and process data and a program in the memory 120, so that all function modules in the processor 107 perform corresponding functions, to control a corresponding component to perform an action according to an instruction requirement.

The radio frequency unit 110 may be configured to receive and send information or receive and send a signal in a call process. For example, the radio frequency unit 110 receives downlink information from a base station, delivers the downlink information to the processor 170 for processing, and sends related uplink data to the base station. Usually, an RF circuit includes but is not limited to an antenna, at least one amplifier, a transceiver, a coupler, a low noise amplifier (LNA), a duplexer, and the like. In addition, the radio frequency unit 110 may further communicate with a network device and another device through wireless communication. The wireless communication may use any communications standard or protocol, which includes but is not limited to a global system for mobile communications (GSM), a general packet radio service (GPRS), code division multiple access (CDMA), wideband code division multiple access (WCDMA), long term evolution (LTE), an email, a short message service (SMS), and the like.

The audio circuit 160, the speaker 161, and the microphone 162 may provide an audio interface between the user and the terminal 100. The audio circuit 160 may convert received audio data into an electrical signal and transmit the electrical signal to the speaker 161. The speaker 161 converts the electrical signal into a sound signal for output. On the other hand, the microphone 162 is configured to collect a sound signal, and may further convert a collected sound signal into an electrical signal. The audio circuit 160 receives the electrical signal and then converts the electrical signal into audio data, and outputs the audio data to the processor 170 for processing. Then, the processor 170 sends processed audio data to, for example, another terminal by using the radio frequency unit 110, or outputs the audio data to the memory 120 for further processing. The audio circuit may further include an earphone jack 163, configured to provide a connection interface between the audio circuit and an earphone.

The terminal 100 further includes the power supply 190 (for example, a battery) that supplies power to each component. In an embodiment, the power supply may be logically connected to the processor 170 through a power supply management system, to implement functions such as charging, discharging, and power consumption management by using the power supply management system.

The terminal 100 further includes the external interface 180. The external interface may be a standard micro USB port, or may be a multi-pin connector. The external interface may be configured to connect the terminal 100 to another apparatus for communication, or may be configured to connect to a charger to charge the terminal 100.

Although not shown, the terminal 100 may further include a flash light, a wireless fidelity (Wi-Fi) module, a Bluetooth module, sensors with various functions, and the like. Details are not described herein. Some or all of the methods described below may be applied to the terminal shown in FIG. 1.

The present application may be applied to a terminal device having a speaker function, and a product on which the present application is implemented may be an intelligent terminal, for example, a product on which speaker is disposed, such as a mobile phone, a tablet, a DV, a video camera, a camera, a portable computer, a notebook computer, a smart speaker, or a television. In an embodiment, a function module is deployed on a DSP chip of a related device, and may be an application program or software in the device. Embodiments of the present application may be deployed on the terminal device, and provides an audio signal processing function through software installation or upgrade and hardware invoking and cooperation, to improve a speaker temperature protection function, thereby giving full play to speaker performance.

The present application is mainly applied to a scenario in which a micro speaker in a terminal needs to be used for playing at a high volume, for example, audio playing in a speaker mode of a multimedia file in a terminal device and hands-free calling. The scenario includes but is not limited to the following scenarios:

application scenario 1: music and movie playing in a speaker mode (mono, dual-channel, and four-channel);

application scenario 2: hands-free calling (carrier calling and network calling);

application scenario 3: mobile phone ringtones (in a speaker mode and in a headset mode); and application scenario 4: game playing in a speaker mode.

In these scenarios, if the micro speaker works with high-level signals, temperature protection needs to be performed on components. This is because a temperature of the speaker may exceed a safety value in the case of the high-level signals. In the case of low-level signals, a risk that the temperature of the speaker exceeds the safety value is low, but a voice coil temperature can still be monitored.

In all the foregoing application scenarios, a temperature and an input power of a speaker voice coil (which may be referred to as a voice coil) may be detected in real time by using the method provided in the present application. If a signal with a relatively high power is played, and the temperature and the power of the speaker voice coil exceed corresponding thresholds (the thresholds are preset based on a physical limit state allowed by the speaker), a temperature control method provided in the present application is triggered, thereby achieving dynamic and smooth reduction of a gain of an input signal, avoiding a sudden change of a speaker volume, ensuring that the temperature of the voice coil does not exceed an upper safety limit of the speaker, and implementing optimal temperature protection for the speaker. The following describes the present application by using examples.

Example 1

Figure 2:
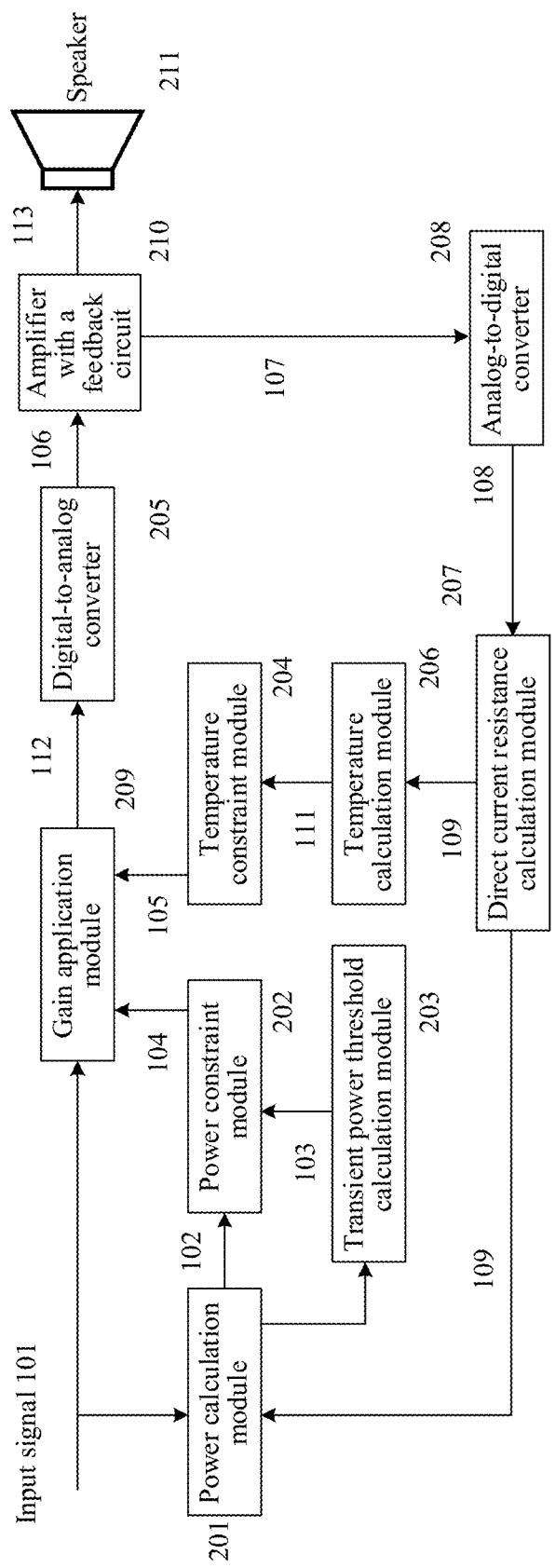
FIG. 2 is a schematic diagram of a structure of an audio signal processing apparatus according to an embodiment.

FIG. 2 shows a structure of an audio signal processing apparatus according to an embodiment. After power constraint processing and temperature constraint processing are performed on an input signal, digital-to-analog conversion is performed on the input signal, and then the input signal is transmitted to an amplifier and finally output to a speaker for playing. The following describes the example 1 with reference to FIG. 2. (Note: In FIGS. 2, 101-109, 111, 112, and 113 indicate signals, and 201-211 indicate modules.)

A system module may include: a power calculation module 201, a power constraint module 202, a transient power threshold calculation module 203, a temperature constraint module 204, a digital-to-analog converter 205, a temperature calculation module 206, a direct current resistance calculation module 207, an analog-to-digital converter 208, a gain application module 209, an amplifier 210 with a feedback circuit, and a speaker 211. A core unit in the system module may include a power constraint unit and a temperature constraint unit. The power constraint unit includes the power calculation module 201, the power constraint module 202, and the transient power threshold calculation module 203.

The temperature constraint unit includes the temperature constraint module 204 and the temperature calculation module 206.

Functions of the modules are as described as follows:

The power calculation module 201 may calculate an input power 102 of a digital audio input signal 101 based on the digital audio input signal 101 and a voice coil direct current resistance 109.

The power constraint module 202 may compare a transient power threshold 103 with the input power 102. If an audio input power is less than or equal to the transient power threshold, no processing is performed on the input signal. In this case, a gain output by the power constraint module is 1. If the audio input power is greater than the transient power threshold, the input signal is weakened. In this case, a power constraint gain 104 output by the power constraint module 202 is a value less than 1. The power constraint gain 104 is positively correlated with a ratio of the transient power threshold to the audio input power. In this way, an input signal with a high power can be effectively constrained.

The transient power threshold calculation module 203 may calculate the transient power threshold 103 based on the input power 102 and a known thermal model parameter of a speaker, and can implement optimal temperature protection by using the transient power threshold 103 to constrain the input signal. In an embodiment, when the speaker is in a working state, a signal input by the speaker changes instantaneously. Therefore, it is more properly and accurate to use a transient threshold for reference and control. The transient threshold is highly referential and real-time relative to the input signal, so that there is no over-protection caused by using a fixed and relatively low steady-state threshold to constrain a transient input power in the conventional technology. For example, an excessively low ratio may result in an excessively low gain, and a play loudness of the speaker is excessively low. Consequently, performance of the speaker cannot be fully used, and a sound that should not be weakened is weakened. Therefore, embodiments of the present application can more efficiently and fully use performance of a speaker and ensure stability of sound playing.

In some embodiments, the transient power threshold may also be some preset values, and may be designed differently based on different powers of input signals.

The temperature constraint module 204 may compare a preset temperature threshold (including but not limited to a maximum temperature allowed for normal working of a component, or a user-defined threshold) with a voice coil temperature 111 calculated by the temperature calculation module 206. If the voice coil temperature is less than or equal to the temperature threshold, no processing is performed on the input signal. In this case, a gain output by the temperature constraint module is 1. If the voice coil temperature is greater than the preset temperature threshold, the input signal is weakened. In this case, a temperature constraint gain 105 output by the temperature constraint module 204 is a value less than 1. The temperature constraint gain 105 is positively correlated with a ratio of the temperature threshold to the voice coil temperature. In this way, a signal with a high temperature can be effectively constrained.

The digital-to-analog converter 205 may convert a gain-adjusted digital signal 112 into an analog signal 106.

The temperature calculation module 206 may calculate the voice coil temperature 111 based on the voice coil direct current resistance 109.

The direct current resistance calculation module 207 may calculate the voice coil direct current resistance 109 of the speaker based on feedback voltage and current signals 108 after analog-to-digital conversion.

The analog-to-digital converter 208 may convert a feedback analog signal 107 into a digital feedback signal 108.

The gain application module 209 may be configured to apply the power constraint gain 104 obtained by the power constraint module 202 and the temperature constraint gain 105 obtained by the temperature constraint module 204 to the digital audio input signal 101 to perform signal adjustment, to obtain the gain-adjusted digital signal 112.

The amplifier 210 with a feedback circuit may be configured to amplify the analog signal 106 into an analog signal 113, and transmit the analog signal 113 to the speaker 211 for playing. The feedback circuit may be configured to sample analog signals at both ends of the speaker, including voltage signals and current signals.

An obtaining module 213 (not shown in the figure) is configured to obtain a digital audio input from a DSP chip.

The digital-to-analog converter 205, the analog-to-digital converter 208, the amplifier 210 with a feedback circuit, and the speaker 211 are well-known technologies or components in the industry, and their functions are also well-known in the industry. Details of these modules are not described in this embodiment of the present application.

Figure 3:
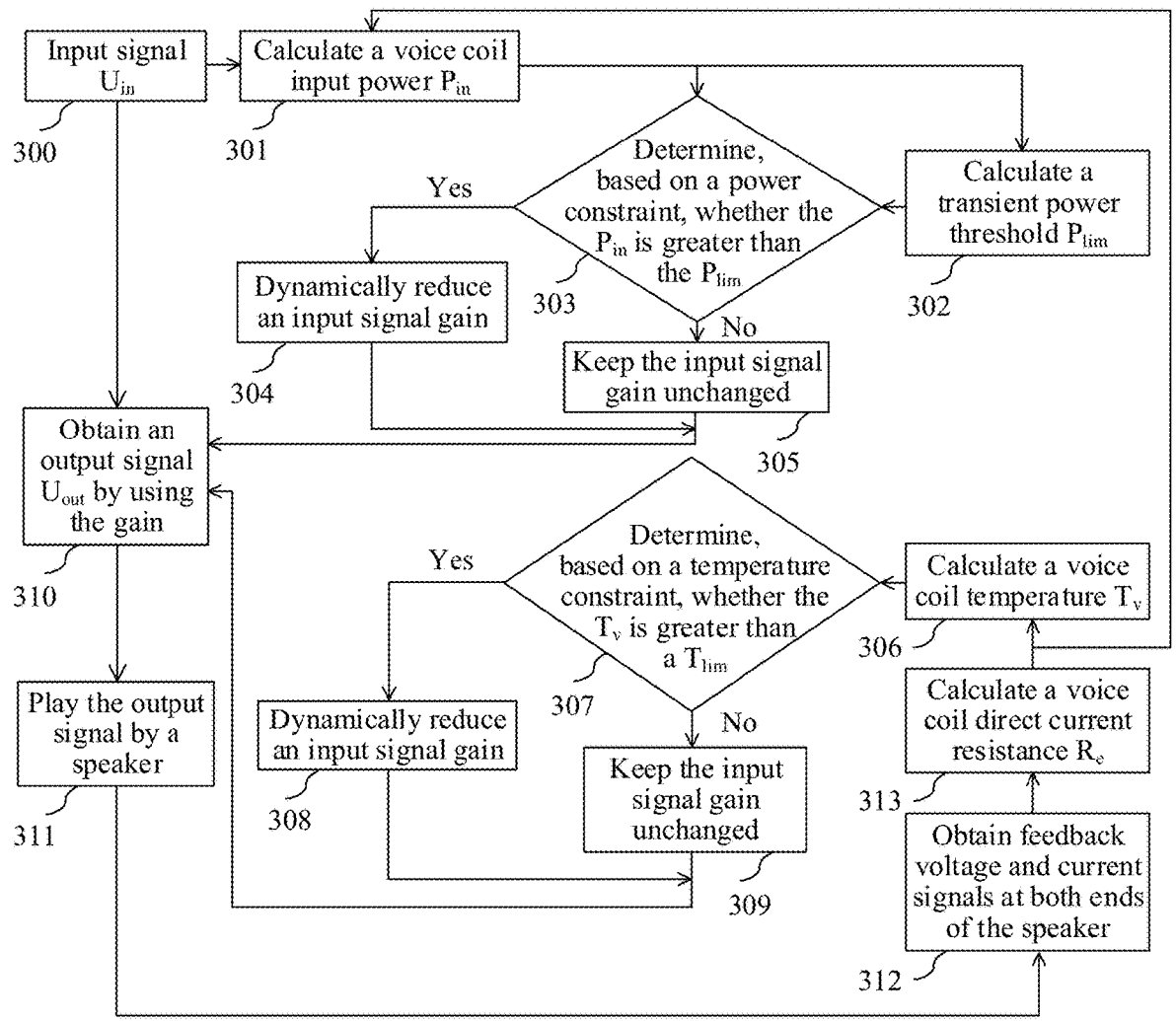
FIG. 3 is a logic diagram of audio signal processing according to an embodiment.

In an embodiment, referring to FIG. 3, which is a logic diagram of signal processing according to an embodiment, the following steps may be included:

step 300: receive an input audio digital signal $U_{in}$ from a DSP chip;

step 301: calculate a voice coil input power $P_{in}$ based on the input audio digital signal $U_{in}$ and a voice coil direct current resistance $R_e$;

step 302: calculate a transient power threshold $P_{lim}$ based on the voice coil input power $P_{in}$ and a known thermal model parameter;

step 303: a power constraint module compares the voice coil input power $P_{in}$ with the transient power threshold $P_{lim}$;

step 304: if $P_{in} > P_{lim}$, dynamically reduce a power constraint gain output by the power constraint module, where a power constraint gain is less than 1;

step 305: if $P_{in} < P_{lim}$, keep the power constraint gain output by the power constraint module unchanged, that is, the gain is 1 (0 dB);

step 306: calculate a voice coil temperature $T_v$ based on the voice coil direct current resistance $R_e$;

step 307: a temperature constraint module compares the voice coil temperature $T_v$ with a preset temperature threshold $T_{lim}$;

step 308: if $T_v > T_{lim}$, dynamically reduce a temperature constraint gain output by the temperature constraint module, where a temperature constraint gain is less than 1;

step 309: if $T_v < T_{lim}$, keep the temperature constraint gain output by the temperature constraint module unchanged, that is, the gain is 1 (0 dB);

step 310: apply the gain (which may be obtained in the step 304 or 305) output by the power constraint module and the gain (which may be obtained in the step 308 or 309) output by the temperature constraint module to the input signal $U_{in}$ to obtain an output signal $U_{out}$;

step 311: a speaker plays an analog signal processed by a PA;

step 312: the PA captures voltage and current signals at both ends of the speaker; and step 313: calculate the voice coil direct current resistance $R_e$ based on feedback voltage and current signals captured by the PA, where the voice coil direct current resistance $R_e$ is used to calculate the voice coil temperature $T_v$ (in the step 301) and the input power $P_{in}$ (in the step 306).

It can be seen that the method includes a feedback mechanism. If a calculation process has a calculation frequency, feedback voltage and current signals captured at a previous time point ($t_{n-1}$) are used to calculate a voice coil direct current resistance $R_e$ at the previous time point, the voice coil direct current resistance $R_e$ at a previous time point is used to calculate a voice coil temperature $T_v$ and an input power $P_{in}$ at a next time point ($t_n$), the voice coil temperature $T_v$ and the input power $P_{in}$ affect an output voltage and an output current at the next time point, feedback is performed continuously. The feedback mechanism is not described in detail in the present application. It should be understood that the feedback mechanism belongs to a well-known technology.

In addition, the previous time point and the next time point are relative concepts, and the previous time point is before the next time point. It is considered that an amplitude of an audio signal does not suddenly change if the audio signal at the previous time point is similar to the audio signal at the next time point (when the amplitude of the audio signal is small enough), but the audio signal is a signal whose amplitude is smooth.

In addition, the two concepts are not limited to a structure with a feedback circuit. In a circuit structure with a feedback circuit, a time difference between the previous time point $t_{n-1}$ and the next time point $t_n$ may be a delay of the feedback circuit. In some circuit structures (for example, the following example 5) without feedback and in some circuit structures with feedback, the time difference between the previous time point $t_{n-1}$ and the next time point $t_n$ may also be a preset time interval defined by a user. In addition, the time difference between the previous time point $t_{n-1}$ and the next time point $t_n$ may be a constant value or a variable value in a signal processing process, or may meet some design conditions of the user. For example, data calculated at the previous time point may be used in related calculation at the next time point, and a calculation result at the next time point may be maintained for a long time. For example, data of at the 100$^{th}$ ms is used in calculation of data of 200 ms from the 200$^{th}$ ms to the 400$^{th}$ ms; alternatively, the data of the 100$^{th}$ ms is used in calculation of data at the 200$^{th}$ ms, and a result is used as a result of the data of the 200 ms from the 200th ms to the 400th ms; or the like.

Figure 4:
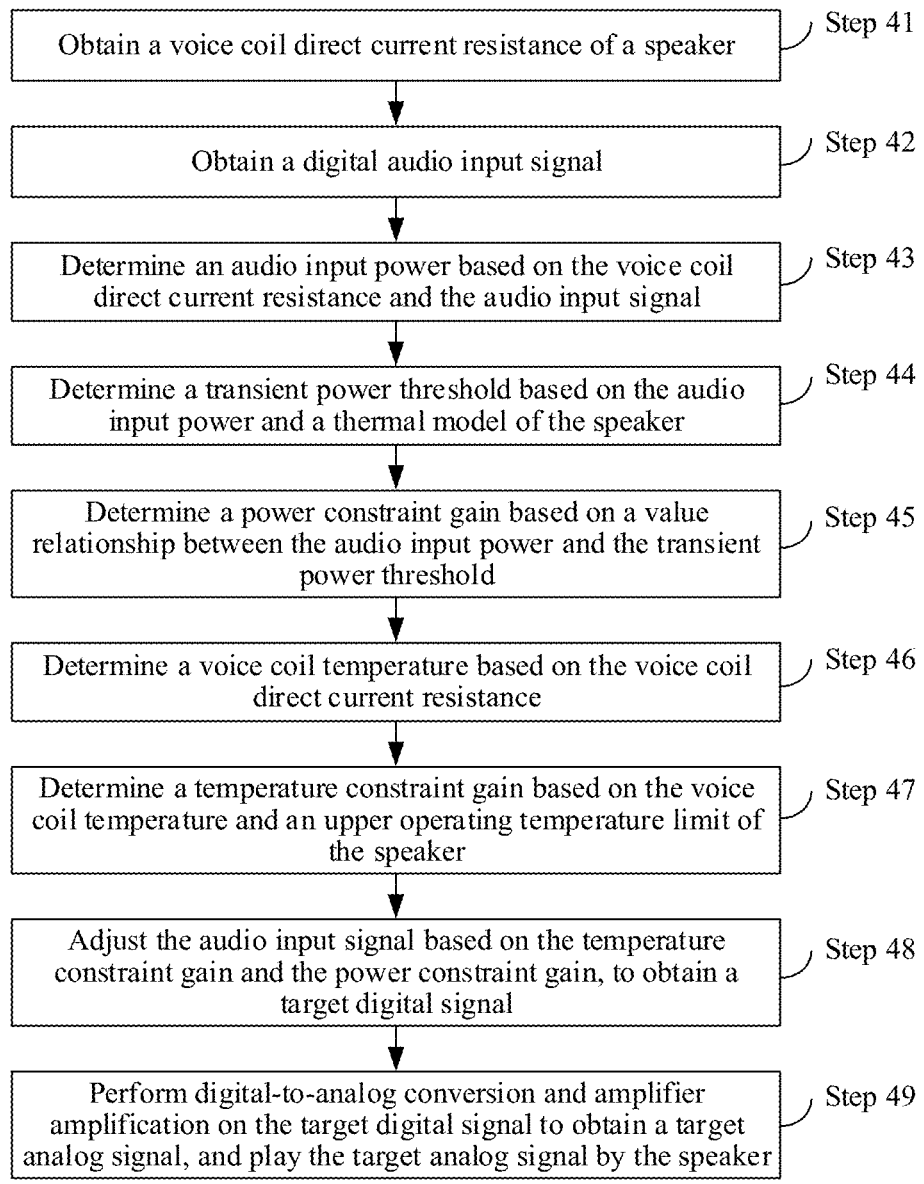
FIG. 4 is a flowchart of an audio signal processing method according to an embodiment.

Refer to FIG. 4. FIG. 4 is a flowchart of an audio signal processing method according to an embodiment. The method may include the following steps.

Step 41: Obtain a voice coil direct current resistance of a speaker.

The amplifier 210 with a feedback circuit obtains voltage signals and current signals, namely, analog feedback signals 107, at two ends of the speaker at a previous time point. The analog feedback signals include feedback voltage and current signals, and are converted into digital feedback signals 108 by an analog-to-digital converter 208. The digital feedback signals include digital feedback voltage and current signals. The previous time point is represented by the foregoing $t_{n-1}$. A direct current resistance calculation module 207 calculates and outputs a voice coil direct current resistance 109 $R_e(t_{n-1})$ based on the digital feedback voltage and current signals. In the calculation method of $R_e(t_{n-1})$, an estimated resistance may be determined by dividing a root mean square (RMS) of a current entering the speaker 211 by a root mean square of a voltage entering the speaker 211. For example, the calculation method is as described in an implementation (e.g., paragraph [0020]) in CN103873985A. Another solution in the conventional technology may also be used in this step, which is not enumerated or limited in the present application.

Step 42: Obtain a digital audio input signal.

An audio input signal 101 at a current time point (which may be understood as a "next time point" in a specific case) is obtained, and is represented by $U_{in}(t_n)$, and the next time point is represented by the foregoing $t_n$. The digital audio input signal may be an output signal of a DSP, and the $U_{in}(t_n)$ can be output to the speaker only after a series of signal processing operations.

A delay between the previous time point and the next time point is related to a delay of a feedback circuit in the amplifier with a feedback circuit in this example. In some other implementation scenarios, the delay between the next time point and the previous time point may alternatively be defined by a user, for example, may be any value between 0 and t0, where t0 is a preset value.

The step of obtaining the digital audio input signal may be performed by an obtaining module 213 (not shown in the figure).

Step 43: Determine an audio input power based on the voice coil direct current resistance and the audio input signal.

The power calculation module 201 calculates the audio input power 102 $P_{in}(t_n)$ based on the voice coil direct current resistance 109 and the audio input signal 101. An implementation includes but is not limited to the following formula:

$$P_{in}(t_n) = \frac{U_{in}^2(t_n)}{R_e(t_{n-1})}$$

Step 44: Determine a transient power threshold based on the audio input power and a thermal model of the speaker.

The transient power threshold calculation module 203 calculates and outputs the transient power threshold 103 $P_{lim}(t_n)$ based on the audio input power 102 $P_{in}(t_n)$ and a known thermal model parameter (belonging to an attribute of a device) of the speaker. An implementation includes but is not limited to the following formula:

$$P_{lim}(t_n) = [T_{lim} - P_{in}(t_n) * Z_m(t_n)] * [Z_v - Z_m]^{-1}$$

Figure 5:
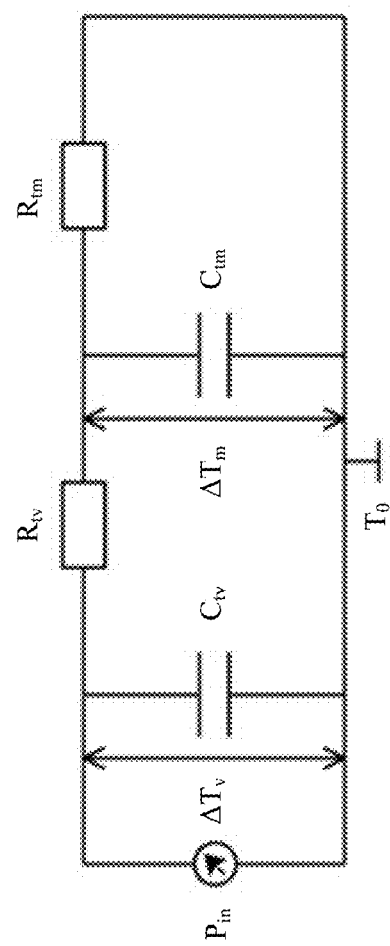
FIG. 5 is a schematic diagram of a thermal model of a speaker according to an embodiment.

In the foregoing formula, * indicates a convolution operation, −1 indicates an inversion operation, Tim indicates a known upper temperature limit of the speaker, and $Z_v$ and $Z_m$ respectively indicate an equivalent thermal impedance transfer function of a voice coil of the speaker and an equivalent thermal impedance transfer function of a magnet of the speaker. The equivalent thermal impedance transfer function may be obtained based on a thermal model shown in FIG. 5 or another known equivalent thermal model. For a specific method, refer to a literature (Chapman, Peter John. "Thermal simulation of loudspeakers." Audio Engineering Society Convention 104. Audio Engineering Society, 1998). Model parameters such as $R_{tv}$, $R_{tm}$, $C_{tv}$ and $C_{tm}$ in FIG. 5 can be measured by an instrument or obtained by using a parameter identification method. The thermal model and thermal model parameters may be provided by a speaker supplier.

Step 45: Determine a power constraint gain based on a value relationship between the audio input power and the transient power threshold.

The power constraint module 202 compares the transient power threshold 103 $P_{lim}(t_n)$ and the audio input power 102

$P_{in}(t_n)$, to output the power constraint gain 104 $G_P(t_n)$. An embodiment includes but is not limited to the following formulas:

$$G_P(t_n) = \begin{cases} \sqrt{\dfrac{P_{lim}(t_n)}{P_{in}(t_n)}}, & \text{if } P_{in}(t_n) > P_{lim}(t_n) \\ 1, & \text{others} \end{cases}$$

Step 46: Determine a voice coil temperature based on the voice coil direct current resistance.

The temperature calculation module 206 obtains voice coil temperature 111 $T_v(t_{n-1})$ based on the voice coil direct current resistance 109 $R_e(t_{n-1})$ at the previous time point. An implementation includes but is not limited to the following formula:

$$T_v(t_{n-1}) = \frac{1}{\alpha}\left(\frac{R_e(t_{n-1})}{R_0} - 1\right) + T_0$$

In the foregoing formula, $R_0$, $T_0$, and $\alpha$ respectively represent a reference direct current resistance, a reference temperature (for example, room temperatures in various standards or a preset temperature), and a voice coil temperature resistance coefficient of the speaker. These parameters may be obtained from a specification of the speaker.

Step 47: Determine a temperature constraint gain based on the voice coil temperature and an upper operating temperature limit of the speaker.

The temperature constraint module 204 compares the voice coil temperature 110 $T_v(t_{n-1})$ with the upper operating temperature limit $T_{lim}$ (a value of the $T_{lim}$ may be a limit value of a working state, or a preset value specified by a manufacturer) of the speaker, and outputs the temperature constraint gain 105 $G_T(t_n)$ based on a value relationship. An implementation includes but is not limited to the following formulas:

$$G_T(t_n) = \begin{cases} \left(\dfrac{T_{lim}}{T_v(t_{n-1})}\right)^2, & \text{if } T_v(t_{n-1}) > T_{lim} \\ 1, & \text{others} \end{cases}$$

Step 48: Adjust the audio input signal based on the temperature constraint gain and the power constraint gain, to obtain a target digital signal.

The gain application module 209 adjusts the audio input signal 101 based on the temperature constraint gain 105 and the power constraint gain 104, to obtain the target digital signal 112. An implementation includes but is not limited to the following formula:

$$U_{out}(t_n) = G_T(t_n) \cdot G_P(t_n) \cdot U_{in}(t_n)$$

In the foregoing formula, when a power constraint is triggered, $G_P(t_n) < 1$, and when a temperature constraint is triggered, $G_T(t_n) < 1$. Therefore, when only the power constraint or the temperature constraint is triggered, or both the power constraint and the temperature constraint are triggered, an amplitude of the output signal $U_{out}(t_n)$ of the speaker is reduced. This causes the voice coil temperature to drop, to achieve a goal of temperature protection.

In a specific implementation process, the input signal $U_{in}(t_n)$ may be multiplied by an optimizing coefficient based on the foregoing formula, and the coefficient may be related to a device and a working state.

Step 49: Perform digital-to-analog conversion and amplifier amplification on the target digital signal to obtain a target analog signal, and play the target analog signal by using the speaker.

In an embodiment, the digital-to-analog converter 205 performs digital-to-analog conversion on the target digital signal 112, to convert the target digital signal 112 into an analog signal 106. The amplifier 210 with a feedback circuit further amplifies the analog signal 106 to obtain a target analog signal 113, and inputs the target analog signal 113 to the speaker 211 for playing.

By using the method in this example, various types of signals can be accurately distinguished through joint control of a power constraint and a temperature constraint, and a gain of an input signal can be dynamically and smoothly controlled, thereby implementing a beneficial effect that a voice coil temperature does not exceed an upper safety limit of a speaker and a speaker volume does not suddenly change when the speaker plays any signal.

Example 2

Figure 6:
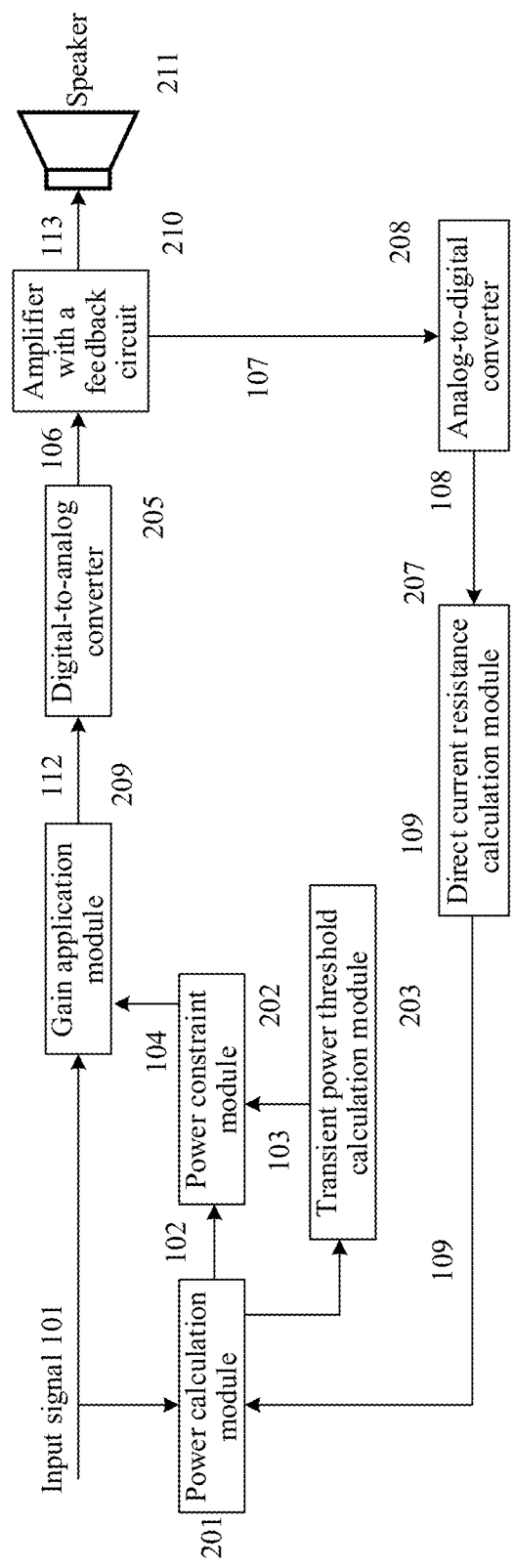
FIG. 6 is a schematic diagram of another audio signal processing apparatus according to an embodiment.

The following describes the example 2 with reference to FIG. 6. FIG. 6 is a schematic diagram of another audio signal processing apparatus according to an embodiment of the present application. Compared with FIG. 2 in the example 1, there is no temperature constraint unit in the example 2, in other words, there is no temperature constraint module 204 or temperature calculation module 206, or the two modules do not work. In this structure, this embodiment provides a procedure of another audio signal processing method. The method may include the following steps.

Step 51 is the same as step 41.
Step 52 is the same as step 42.
Step 53 is the same as step 43.
Step 54 is the same as step 44.
Step 55 is the same as step 45.
Step 56: Adjust the audio input signal based on the power constraint gain, to obtain a target digital signal. The gain application module 209 adjusts the audio input signal 101 based on the power constraint gain 104, to obtain the target digital signal 112. An implementation includes but is not limited to the following formula:

$$U_{out}(t_n) = G_P(t_n) \cdot U_{in}(t_n)$$

In a specific implementation process, the input signal $U_{in}(t_n)$ may be multiplied by an optimizing coefficient based on the foregoing formula, and the coefficient may be related to a component and a working state.

Step 57: Perform digital-to-analog conversion and amplifier amplification on the target digital signal 112 obtained in step 56 to obtain a target analog signal, and play the target analog signal by using the speaker. This step is similar to step 49.

Example 3

Figure 7:
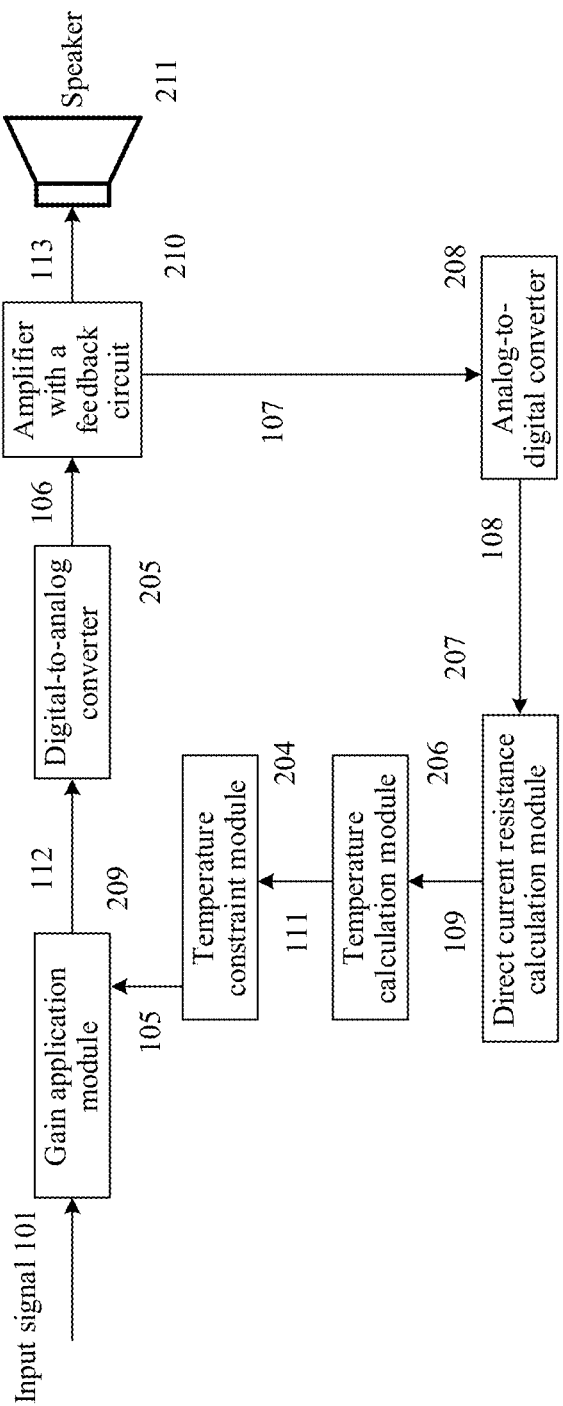
FIG. 7 is a schematic diagram of another audio signal processing apparatus according to an embodiment.

The following describes the example 3 with reference to FIG. 7. FIG. 7 is a schematic diagram of another audio signal processing apparatus according to an embodiment. Compared with FIG. 2 in the example 1, there is no power constraint unit in the example 3, in other words, there is no power calculation module 201, power constraint module 202, or transient power threshold calculation module 203, or the three modules do not work. In this structure, this embodiment provides a procedure of another audio signal processing method. The method may include the following steps.

Step 61 is the same as step 41.
Step 62 is the same as step 46.
Step 63 is the same as step 47.
Step 64: Adjust the audio input signal based on the temperature constraint gain, to obtain a target digital signal. The gain application module 209 adjusts the audio input signal 101 based on the temperature constraint gain 105, to obtain the target digital signal 112. An implementation includes but is not limited to the following formula:

$$U_{out}(t_n,d) = G_T(t_n) \cdot U_{in}(t_n)$$

In a specific implementation process, the input signal $U_{in}(t_n)$ may be multiplied by an optimizing coefficient based on the foregoing formula, and the coefficient may be related to a component and a working state.

Step 65: Perform digital-to-analog conversion and amplifier amplification on the target digital signal 112 obtained in step 64 to obtain a target analog signal, and play the target analog signal by using the speaker. This step is similar to step 49.

Example 4

Figure 8:
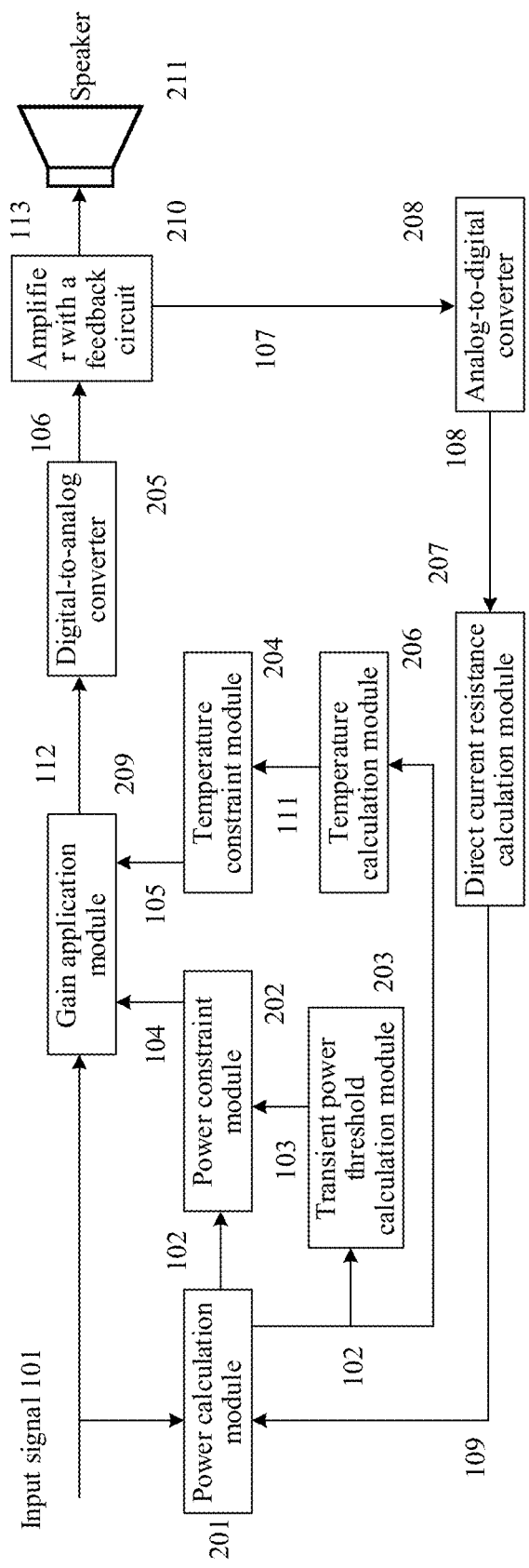
FIG. 8 is a schematic diagram of another audio signal processing apparatus according to an embodiment.

The following describes the example 4 with reference to FIG. 8. FIG. 8 is a diagram of a structure of another system-level module according to an embodiment. Compared with FIG. 2 in the example 1, a function of the temperature calculation module 206 is changed. An input is first changed, and the temperature calculation module 206 calculates the voice coil temperature based on an input power of an audio, and no longer calculates the voice coil temperature by using a direct current resistance. In this structure, this embodiment provides a procedure of another audio signal processing method. The method may include the following steps.

Step 71 is the same as step 41.
Step 72 is the same as step 42.
Step 73 is the same as step 43.
Step 74 is the same as step 44.
Step 75 is the same as step 45.
Step 76: The temperature calculation module 206 calculates the voice coil temperature 111 $T_v(t_{n-1})$ based on the audio input power 102 $P_{in}(t_n)$ and the voice coil equivalent thermal impedance transfer function $Z_v$ of the speaker, and transmits the voice coil temperature to the temperature constraint module 204, where the equivalent thermal impedance transfer function $Z_v$ may be obtained from component specifications of the speaker, or may be provided by a supplier, or may be measured by a user by using an instrument, or may be obtained through calculation by using an algorithm. A calculation method of the $T_v(t_{n-1})$ includes but is not limited to the following formulas:

$$\Delta T_v(t_{n-1}) = P_{in}(t_n) * Z_v$$

$$T_v(t_{n-1}) = \Delta T_v(t_{n-1}) + T_0$$

In the foregoing formula, * indicates convolution operation, $\Delta T_v(t_{n-1})$ indicates a voice coil temperature rise, and $T_0$ indicates a known reference temperature (for example, a room temperature in a common standard or a temperature specified in the component specifications).

That is, a difference between this step and the example 1 may be understood as that algorithms of the $T_v(t_{n-1})$ are different.

Step 77 is similar to step 47, and a difference between step 77 and step 47 lies in that, for the temperature constraint module 201, an input voice coil temperature is from step 76.

Step 78 is the same as step 48.
Step 79 is the same as step 49.

Example 5

In the above examples, the voice coil direct current resistance of the speaker is calculated based on voltage and current signals fed back by a power amplifier. However, these examples cannot be applicable to a low-end terminal device without a feedback structure, and optimal temperature protection measures cannot be implemented for speakers of such devices. Optimal temperature protection means that a gain output by a temperature protection algorithm has a minimum impact on an input signal while ensuring that the voice coil temperature of the speaker does not exceed an upper safety limit of a component. In this way, the speaker volume of the speaker may not be reduced to a maximum extent. In view of this problem, embodiments of the present application further provide the example 5.

Figure 9:
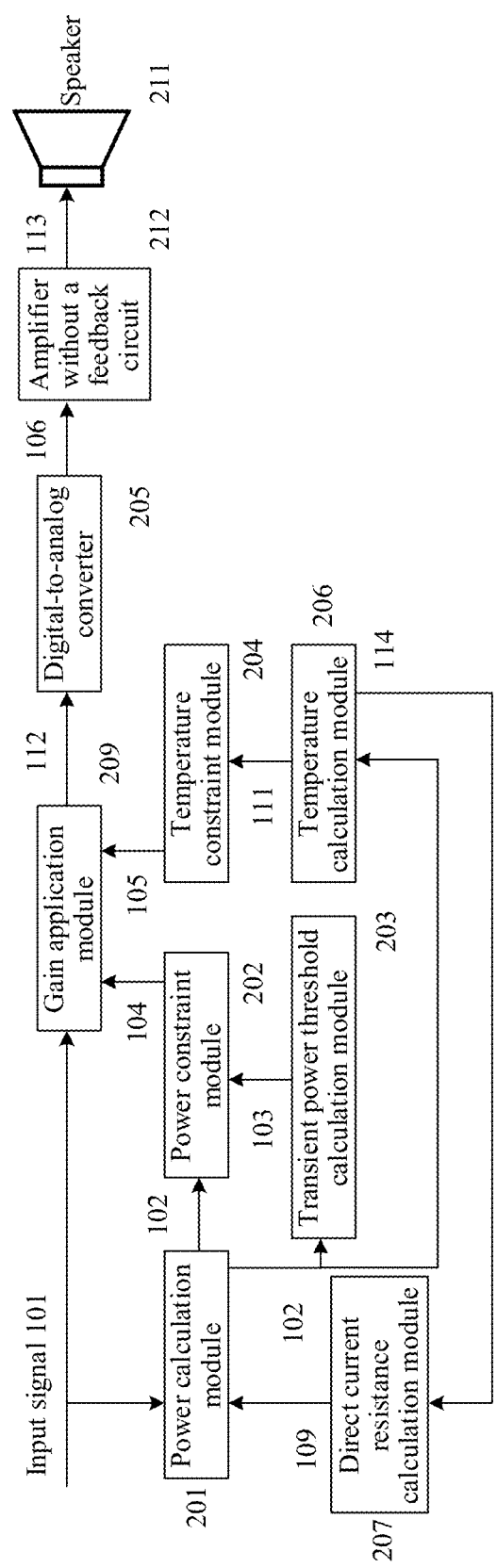
FIG. 9 is a schematic diagram of another audio signal processing apparatus according to an embodiment.

The following describes the example 5 with reference to FIG. 9. FIG. 9 is a diagram of a structure of another system-level module according to an embodiment. If a low-end device PA cannot feed back voltage and current signals, a direct current resistance cannot be calculated based on feedback signals. The example 5 presents a method for calculating a direct current resistance without a feedback signal. Compared with FIG. 8 in the example 4, the original amplifier 210 with a feedback circuit is changed to an amplifier 212 without a feedback circuit. In addition, the analog-to-digital converter 208 does not exist in a feedback loop, or the analog-to-digital converter 208 is not enabled in this embodiment. Therefore, without a feedback signal, the direct current resistance of the voice coil cannot be calculated by using the feedback signal. In addition, a calculation method of the direct current resistance calculation module 207 in the example 5 is also different from that in the example 4. The temperature calculation module 206 first calculates a voice coil temperature rise 114 based on an input power of an audio, and then the direct current resistance calculation module 207 calculates the direct current resistance of the voice coil. In this structure, this embodiment provides a procedure of another audio signal processing method. The method may include the following steps.

Step 81: The temperature calculation module 206 calculates the voice coil temperature rise 114 $\Delta T_v(t_{n-1})$, namely, a variation amount of the voice coil temperature based on an input power 102 $P_{in}(t_{n-1})$ at a previous time point and a known voice coil equivalent thermal impedance transfer function $Z_v$. The direct current resistance calculation module 207 calculates the voice coil direct current resistance $R_e(t_{n-1})$ based on the $\Delta T_v(t_{n-1})$. An implementation includes but is not limited to the following formulas:

$$\Delta T_v(t_{n-1}) = P_{in}(t_n) * Z_v$$

$$R_e(t_{n-1}) = R_0[1 + \alpha \cdot \Delta T_v(t_{n-1})]$$

In the foregoing formula, $R_0$, $T_0$, and a respectively represent a reference direct current resistance, a reference temperature (for example, room temperatures in various standards or a preset temperature), and a voice coil temperature resistance coefficient of the speaker. These parameters may be obtained from the specification of the speaker.

Step 82 is the same as step 72.

Step 83 is similar to step 73; and a difference between step 83 and step 73 lies in that, for the power calculation module 201, an input voice coil direct current resistance is from step 81.

Step 84 is the same as step 74.
Step 85 is the same as step 75.
Step 86 is the same as step 76.
Step 87 is the same as step 77.
Step 88 is the same as step 78.
Step 89 is the same as step 79.

The example 5 provides a direct current resistance calculation method in a case in which there is no feedback voltage signal or feedback current signal, to resolve over-protection caused because the voice coil temperature cannot be predicted, and this method has an important application value in improving loudness of the speaker of the low-end terminal device. In addition, the method implements a function that a speaker temperature can still be predicted when there is no feedback signal is implemented, and the method is compatible with a low-end terminal device that cannot provide a feedback signal.

It should be understood that, in different examples of the present application, signals indicated by a same signal reference numeral may have different sources or may be obtained by using different algorithms, which does not constitute a limitation. Functions included in function modules indicated by a same module reference numeral may also be different in functions and algorithms, which should not constitute a limitation. In addition, in step references of different examples, "the same as step xx" focuses more on that signal processing logics of the two steps are similar, both inputs and outputs in the two steps are not limited to be completely the same, and two functional modules are not limited to be completely the same.

Figure 10:
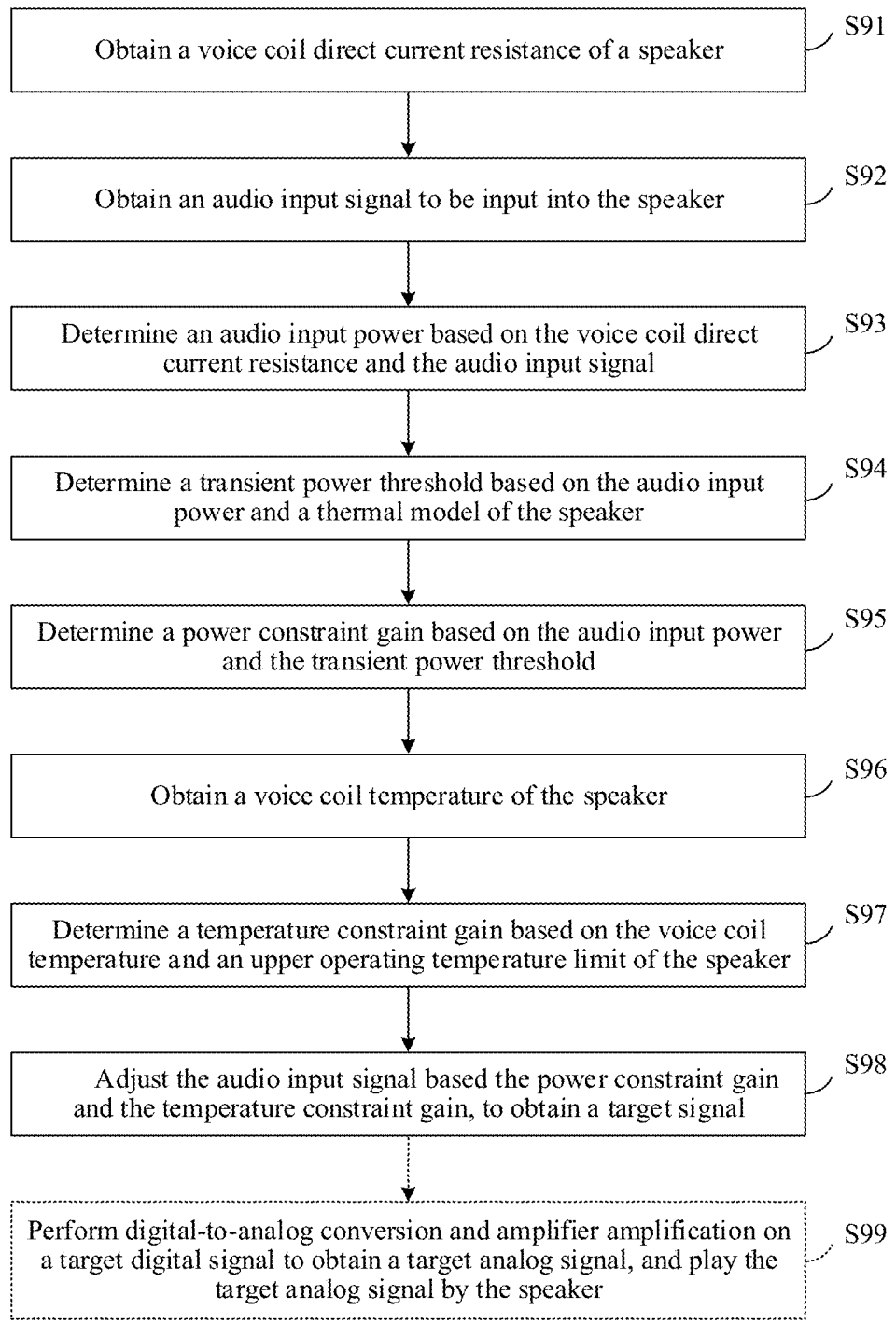
FIG. 10 is a flowchart of another audio signal processing method according to an embodiment.

Refer to FIG. 10. FIG. 10 is a flowchart of another audio signal processing method according to an embodiment. The method includes the following steps.

S91: Obtain a voice coil direct current resistance of a speaker.

In an embodiment, S91 may include but is not limited to step 41 or step 81. It should be understood that all voice coil direct current resistances obtained in this step may be used in operations related to a voice coil direct current resistance in the following steps.

S92: Obtain an audio input signal to be input into the speaker.

In an embodiment, S92 may include but is not limited to step 42.

S93: Determine an audio input power based on the voice coil direct current resistance and the audio input signal.

In an embodiment, S93 may include but is not limited to step 43.

S94: Obtain a thermal model of the speaker, and determine a transient power threshold based on the audio input power and the thermal model.

In an embodiment, S94 may include but is not limited to step 44.

S95: Determine a power constraint gain based on the audio input power and the transient power threshold, where if the audio input power is greater than the transient power threshold, the power constraint gain is less than 1.

In an embodiment, S95 may include but is not limited to step 45.

S96: Obtain a voice coil temperature of the speaker.

In an embodiment, S96 may include but is not limited to step 46 or step 76. It should be understood that all voice coil temperatures obtained in this step may be used in operations related to a voice coil temperature in the following steps.

S97: Determine a temperature constraint gain based on the voice coil temperature and an upper operating temperature limit of the speaker, where if the voice coil temperature is greater than the upper operating temperature limit of the speaker, the temperature constraint gain is less than 1.

In an embodiment, S97 may include but is not limited to step 47 or step 77.

S98: Adjust the audio input signal based on the power constraint gain and the temperature constraint gain, to obtain a target signal.

In an embodiment, S98 may include but is not limited to step 48.

S99: Perform digital-to-analog conversion and amplifier amplification on a target digital signal to obtain a target analog signal, and play the target analog signal by using the speaker.

In an embodiment, S99 may include but is not limited to step 49, step 57 or step 65.

The present application provides an audio signal processing method in which a dynamic gain smoothing processing input signal is output through a combined action of a power constraint and a temperature constraint, to perform temperature protection on a speaker. The benefits are as follows:

(1) A joint control policy with a power constraint (reflected in a power constraint gain) and a temperature constraint (reflected in a temperature constraint gain) and a dynamic gain control calculation method are proposed, to resolve problems of over-protection and output gain sudden changes caused by inability to accurately distinguish various signals. Therefore, subjective experience such as a speaker volume of a terminal device can be maximally improved while a voice coil temperature of the speaker is protected from being overloaded, and a problem of a sudden change of subjective listening of a user in a scenario such as speaker playing of the terminal device can be completely resolved.

(2) A transient power threshold calculation method is proposed to resolve over-protection caused by an excessively low steady-state power threshold, so that an output gain of a protection algorithm can be effectively improved, and subjective experience such as the speaker volume of the terminal device can be improved.

Based on the audio signal processing method provided in the foregoing embodiments, an embodiment provides an audio signal processing apparatus. The apparatus may be applied to a plurality of types of terminal devices, and the terminal device may be any implementation form of the terminal 100, for example, a small terminal including a speaker. The apparatus includes:

a direct current resistance calculation module 207, configured to obtain a voice coil direct current resistance of a speaker. A specific implementation form of a function of the direct current resistance calculation module 207 includes but is not limited to an implementation method of the direct current resistance calculation module 207 corresponding to the example in the example 1, the example 4, or the example 5. This module is specifically configured to perform the method in S91 and a method for equivalent replacement, and this module may be implemented by a processor by invoking a corresponding program instruction in a memory and using a specific algorithm.

The apparatus further includes an obtaining module 213, configured to obtain an audio input signal to be input into the speaker. A specific implementation form of a function of the obtaining module 213 includes but is not limited to an implementation method of the corresponding obtaining module 207 in the example 1. This module is specifically configured to perform the method in S92 and a method for equivalent replacement, and this module may be implemented by the processor by invoking a corresponding program instruction in the memory to obtain an audio signal from an audio circuit interface.

The apparatus further includes a power calculation module 201, configured to determine an audio input power based on the voice coil direct current resistance and the audio input signal. A specific implementation form of a function of the power calculation module 201 includes but is not limited to an implementation method of the power calculation module 201 corresponding to the example in the example 1, the example 4, or the example 5. This module is specifically configured to perform the method in S93 and a method for equivalent replacement, and this module may be implemented by the processor by invoking a corresponding program instruction in the memory and using a specific algorithm.

The apparatus further includes a transient power threshold calculation module 203, configured to obtain a thermal model of the speaker, and determine a transient power threshold based on the audio input power and the thermal model of the speaker. A specific implementation form of a function of the transient power threshold calculation module 203 includes but is not limited to an implementation method of the transient power threshold calculation module 203 corresponding to the example in the example 1, the example 4, or the example 5. This module is specifically configured to perform the method in S94 and a method for equivalent replacement, and this module may be implemented by the processor by invoking a corresponding program instruction in the memory and using a specific algorithm.

The apparatus further includes a power constraint module 202, configured to determine a power constraint gain based on the audio input power and the transient power threshold, where if the audio input power is greater than the transient power threshold, the power constraint gain is less than 1. A specific implementation form of a function of the power constraint module 202 includes but is not limited to an implementation method of the power constraint module 202 corresponding to the example in the example 1, the example 4, or the example 5. This module is specifically configured to perform the method in S95 and a method for equivalent replacement, and this module may be implemented by the processor by invoking a corresponding program instruction in the memory and using a specific algorithm.

The apparatus further includes a temperature calculation module 206, configured to obtain a voice coil temperature of the speaker. A specific implementation form of a function of the temperature calculation module 206 includes but is not limited to an implementation method of the temperature calculation module 206 corresponding to the example in the example 1, the example 4, or the example 5. This module is specifically configured to perform the method in S96 and a method for equivalent replacement, and this module may be implemented by the processor by invoking a corresponding program instruction in the memory and using a specific algorithm.

The apparatus further includes a temperature constraint module 204, configured to determine a temperature constraint gain based on the voice coil temperature and an upper operating temperature limit of the speaker, where if the voice coil temperature is greater than the upper operating temperature limit of the speaker, the temperature constraint gain is less than 1. A specific implementation form of a function of the temperature constraint module 204 includes but is not limited to an implementation method of the temperature constraint module 204 corresponding to the example in the example 1, the example 4, or the example 5. This module is specifically configured to perform the method in S97 and a method for equivalent replacement, and this module may be implemented by the processor by invoking a corresponding program instruction in the memory and using a specific algorithm.

The apparatus further includes a gain application module 209, configured to adjust the audio input signal based power constraint gain and temperature constraint gain, to obtain a target signal. A specific implementation form of a function of the gain application module 209 includes but is not limited to an implementation method of the gain application module 209 corresponding to the example in the example 1, the example 4, or the example 5. This module is specifically configured to perform the method in S98 and a method for equivalent replacement, and this module may be implemented by the processor by invoking a corresponding program instruction in the memory and using a specific algorithm.

In addition, the apparatus may further include:

a digital-to-analog converter 205, configured to convert the target signal into an analog signal, where a specific implementation form of a function of the digital-to-analog converter 205 includes but is not limited to an implementation method of the digital-to-analog converter 205 corresponding to the example in the example 1, the example 4, or the example 5; and an amplifier 210 or 212, configured to amplify the analog signal to obtain a target analog signal, and transmit the target analog signal to the speaker for playing. A specific implementation form of a function of the amplifier 210 includes but is not limited to an implementation method of the amplifier 210 corresponding to the example in the example 1 or the example 4. A specific implementation form of a function of the amplifier 212 includes but is not limited to an implementation method of the amplifier 212 corresponding to the example in the example 5. It should be understood that the amplifier 210 includes a feedback circuit. When the amplifier 210 is used, an analog-to-digital converter 208 may further be included. A specific implementation form of a function of the analog-to-digital converter 208 includes but is not limited to an implementation method of the analog-to-digital converter 208 corresponding to the example in the example 1 or the example 4.

The digital-to-analog converter 205 and the amplifier 210 or 212 are jointly configured to perform the method in S99 and a method for equivalent replacement.

The foregoing specific method examples, explanations and descriptions of technical features in the embodiments, and extensions of a plurality of implementation forms are also applicable to method execution in the apparatus, and details are not described in the apparatus embodiments.

It should be understood that division into the modules in the foregoing apparatus is merely logical function division. In an actual implementation, some or all of the modules may be integrated into one physical entity, or may be physically separated. For example, each of the foregoing modules may be a separate processing element, or may be integrated on a chip of a terminal, or may be stored in a storage element of a controller in a form of program code. A processing element of the processor invokes and executes a function of each of the foregoing modules. In addition, the modules may be integrated or may be implemented independently. The processing element may be an integrated circuit chip and has a signal processing capability. In an implementation process, the steps in the foregoing methods or the foregoing modules can be implemented by using a hardware integrated logical circuit in the processing element, or by using instructions in a form of software. The processing element may be a general-purpose processor, for example, a central processing unit (English: central processing unit, CPU for short), or may be one or more integrated circuits configured to implement the foregoing methods, for example, one or more application-specific integrated circuits (English: application-specific integrated circuit, ASIC for short), one or more microprocessors (English: digital signal processor, DSP for short), or one or more field programmable gate arrays (English: field-programmable gate array, FPGA for short).

It should be understood that the terms "first", "second", and the like in the specification, claims, and accompanying drawings of the present application are intended to distinguish between similar objects but do not necessarily indicate a specific order or sequence. It should be understood that the data termed in such a way are interchangeable in proper circumstances so that the embodiments of the present application described herein can be implemented in other orders than the order illustrated or described herein. Moreover, the terms "include", "contain" and any other variants mean to cover the non-exclusive inclusion, for example, a process, method, system, product, or device that includes a list of steps or modules is not necessarily limited to those modules, but may include other modules not expressly listed or inherent to such a process, method, system, product, or device.

Persons skilled in the art should understand that the embodiments of the present application may be provided as a method, a system, or a computer program product. Therefore, the present application may use a form of hardware only embodiments, software only embodiments, or embodiments with a combination of software and hardware. Moreover, the present application may use a form of a computer program product that is implemented on one or more computer-usable storage media (including but not limited to a disk memory, a CD-ROM, an optical memory, and the like) that include computer-usable program code.

The present application is described with reference to the flowcharts and/or block diagrams of the method, the device (system), and the computer program product according to the embodiments of the present application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may be stored in a computer readable memory that can instruct the computer or any other programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

Although embodiments of the present application have been described, persons skilled in the art can make changes and modifications to these embodiments once they learn the basic inventive concept. Therefore, the following claims are intended to be construed as to cover the embodiments and all changes and modifications falling within the scope of the present application. Obviously, persons skilled in the art can make various modifications and variations to the embodiments of the present application without departing from the spirit and scope of the embodiments of the present application. The present application is intended to cover these modifications and variations provided that they fall within the scope of protection defined by the following claims and their equivalent technologies.

What is claimed is:

1. An method of audio signal processing, the method comprising:
    obtaining a voice coil direct current resistance of a speaker;
    obtaining an audio input signal to be input into the speaker;
    determining an audio input power based on the voice coil direct current resistance and the audio input signal;
    obtaining a thermal model of the speaker, and determining a transient power threshold based on the audio input power and the thermal model;
    determining a power constraint gain based on the audio input power and the transient power threshold, wherein determining the power constraint gain comprises when the audio input power is greater than the transient power threshold, determining the power constraint gain is less than 1;
    obtaining a voice coil temperature of the speaker;
    determining a temperature constraint gain based on the voice coil temperature and an upper operating temperature limit of the speaker, wherein determining the temperature constraint gain comprises when the voice coil temperature is greater than the upper operating temperature limit of the speaker, determining the temperature constraint gain is less than 1; and
    adjusting the audio input signal based on the power constraint gain and the temperature constraint gain, to obtain a target signal.

2. The method according to claim 1, wherein the power constraint gain is positively correlated with a ratio of the transient power threshold to the audio input power.

3. The method according to claim 1, wherein the temperature constraint gain is positively correlated with a ratio of the upper operating temperature limit to the voice coil temperature.

4. The method according to claim 1, wherein determining the power constraint again further comprises:
    when the audio input power is less than or equal to the transient power threshold, determining the power constraint gain is equal to 1; and
    determining the temperature constraint gain further comprises:

when the voice coil temperature is less than or equal to the upper operating temperature limit of the speaker, determining the temperature constraint gain is equal to 1.

5. The method according to claim 1, wherein obtaining the voice coil direct current resistance of the speaker comprises:
   obtaining feedback voltage signals and feedback current signals at two ends of the speaker by using a feedback circuit; and
   obtaining the voice coil direct current resistance based on the feedback voltage signals and the feedback current signals.

6. The method according to claim 1, wherein obtaining the voice coil direct current resistance of the speaker comprises:
   obtaining a voice coil equivalent thermal impedance transfer function of the speaker;
   calculating a variation amount of the voice coil temperature based on the voice coil equivalent thermal impedance transfer function; and
   calculating the voice coil direct current resistance of the speaker based on the variation amount of the voice coil temperature.

7. The method according to claim 1, wherein obtaining the voice coil temperature of the speaker comprises:
   calculating the voice coil temperature of the speaker based on the voice coil direct current resistance.

8. The method according to claim 1, wherein obtaining the voice coil temperature of the speaker comprises:
   obtaining a voice coil equivalent thermal impedance transfer function of the speaker; and
   calculating the voice coil temperature based on the voice coil equivalent thermal impedance transfer function.

9. The method according to claim 1, further comprising: performing digital-to-analog conversion and amplification on the target signal, and transmitting an amplified analog signal to the speaker for playing.

10. An audio signal processing apparatus, comprising:
    a non-transitory computer-readable storage medium having stored thereon instructions which when executed by a processor cause the processor to:
    obtain a voice coil direct current resistance of a speaker;
    obtain an audio input signal to be input into the speaker;
    determine an audio input power based on the voice coil direct current resistance and the audio input signal;
    obtain a thermal model of the speaker, and determine a transient power threshold based on the audio input power and the thermal model of the speaker;
    determine a power constraint gain based on the audio input power and the transient power threshold, wherein determining the power constraint gain comprises when the audio input power is greater than the transient power threshold, determining the power constraint gain is less than 1;
    obtain a voice coil temperature of the speaker;
    determine a temperature constraint gain based on the voice coil temperature and an upper operating temperature limit of the speaker, wherein determining the temperature constraint gain comprises when the voice coil temperature is greater than the upper operating temperature limit of the speaker, determining the temperature constraint gain is less than 1; and
    adjust the audio input signal based on the power constraint gain and the temperature constraint gain, to obtain a target signal.

11. The apparatus according to claim 10, wherein the power constraint gain is positively correlated with a ratio of the transient power threshold to the audio input power; and the temperature constraint gain is positively correlated with a ratio of the upper operating temperature limit to the voice coil temperature.

12. The apparatus according to claim 10, wherein determining the temperature constraint gain further comprises when the voice coil temperature is less than or equal to the upper operating temperature limit of the speaker, determining the temperature constraint gain is equal to 1.

13. The apparatus according to claim 10, wherein obtaining the voice coil direct current resistance of the speaker comprises:
    obtaining feedback voltage signals and feedback current signals at two ends of the speaker by using a feedback circuit, and
    obtaining the voice coil direct current resistance based on the feedback voltage signals and the feedback current signals; or
    obtaining a voice coil equivalent thermal impedance transfer function of the speaker,
    calculating a variation amount of the voice coil temperature based on the voice coil equivalent thermal impedance transfer function, and
    calculating the voice coil direct current resistance of the speaker based on the variation amount of the voice coil temperature.

14. The apparatus according to claim 10, wherein obtaining the voice coil temperature of the speaker comprises:
    calculating the voice coil temperature of the speaker based on the voice coil direct current resistance; or
    obtaining a voice coil equivalent thermal impedance transfer function of the speaker, and
    calculating the voice coil temperature based on the voice coil equivalent thermal impedance transfer function.

15. The apparatus according to claim 10, further comprising:
    a digital-to-analog converter configured to convert the target signal into an analog signal; and
    an amplifier configured to amplify the analog signal to obtain a target analog signal, and transmit the target analog signal to the speaker for playing.

16. A terminal device, comprising:
    a processor; and
    a memory coupled to the processor to store instructions, which when executed by the processor, cause the processor to perform operations, the operations comprising:
    obtaining a voice coil direct current resistance of a speaker;
    obtaining an audio input signal to be input into the speaker;
    determining an audio input power based on the voice coil direct current resistance and the audio input signal;
    obtaining a thermal model of the speaker, and determining a transient power threshold based on the audio input power and the thermal model;
    determining a power constraint gain based on the audio input power and the transient power threshold, wherein determining the power constraint gain comprises when the audio input power is greater than the transient power threshold, determining the power constraint gain is less than 1;
    obtaining a voice coil temperature of the speaker;
    determining a temperature constraint gain based on the voice coil temperature and an upper operating temperature limit of the speaker, wherein determining the temperature constraint gain comprises when the voice coil temperature is greater than the upper operating temperature limit of the speaker, determining the temperature constraint gain is less than 1; and adjusting the audio input signal based on the power constraint gain and the temperature constraint gain, to obtain a target signal.

17. The terminal device according to claim 16, further comprising:

an antenna system to:
- receive and send wireless communication signals under control of the processor, and
- wirelessly communicate with a mobile communications network, wherein the mobile communications network comprises at least one of: a global system for mobile communications (GSM) network, a code division multiple access (CDMA) network, a 3G network, a 4G network, a 5G network, an frequency-division multiple access (FDMA) network, a time-division multiple access (TDMA) network, a personal digital cellular (PDC) network, a total access communication system (TACS) network, an advanced mobile phone system (AMPS) network, a wideband code division multiple access (WCDMA) network, a time division synchronous code division multiple access (TDSCDMA) network, a Wi-Fi network, or a long term evolution (LTE) network.

* * * * *